United States Patent [19]
Tung

[11] Patent Number: 4,954,827
[45] Date of Patent: Sep. 4, 1990

[54] ANALOG DIGITAL CASCADE CONVERTER

[75] Inventor: Pham N. Tung, Paris, France

[73] Assignee: Thomson Hybrides et Microondes, Paris, France

[21] Appl. No.: 269,011

[22] Filed: Nov. 9, 1988

[30] Foreign Application Priority Data

Nov. 10, 1987 [FR] France ................ 87 15535

[51] Int. Cl.[5] .................................. H03M 1/36
[52] U.S. Cl. ............................ 341/159; 341/133
[58] Field of Search ............ 341/159, 126, 158, 133, 341/136, 161

[56] References Cited

U.S. PATENT DOCUMENTS

| | | | |
|---|---|---|---|
| 3,594,766 | 7/1971 | Gilbert | 341/159 |
| 3,858,200 | 12/1974 | Henry | 341/159 |
| 4,542,370 | 9/1985 | Yamada et al. | 341/133 |
| 4,608,555 | 8/1986 | Hoeft | 341/159 X |

FOREIGN PATENT DOCUMENTS 112180 6/1984 European Pat. Off. .

OTHER PUBLICATIONS

Patent Abstracts of Japan, vol. 7, No. 65 (E-165) [1210], Mar. 18, 1983.

Primary Examiner—William M. Shoop, Jr.
Assistant Examiner—Sharon D. Logan
Attorney, Agent, or Firm—Oblon, Spivak, McClelland, Maier & Neustadt

[57] ABSTRACT

In an analog-digital converter working at microwave frequencies, the input signal is addressed in parallel to bit levels which are in cascade with one another. Each bit level has a transducer which converts the voltage into a current, and compares this current with a calibrated source. The resultant current is addressed to a logic circuit, the output of which delivers a bit. An intermediate output of the logic circuit constitutes a control signal which regulates the currents of the analog comparators of the less significant bit levels. The calibrated currents are in geometrical progression.

9 Claims, 3 Drawing Sheets

ANALOG DIGITAL CASCADE CONVERTER

BACKGROUND OF THE INVENTION

1. Field of the Invention

The present invention concerns an analog-digital converter. It is designed to work at microwave frequencies at very high conversion speeds, and converts an analog signal into a precision digital signal with a large number of bits, through three stages only. The present invention requires only a small number of transistors, most of which work in parallel and do not affect the conversion time. The input signal, addressed to as many comparator circuits as there are bits in the output signals, is separated from it only by two gate-drain junctions of two transistors. The comparators work in cascade.

This converter converts, firstly, the analog input voltage $V_E$ into an analog current $I_E$ then, for each output bit level, it compares this current $I_E$ with a calibrated current $nI_o$. The resulting positive or negative current is addressed to a logic circuit, a first output of which partly controls the comparators of all the levels of less signficant bits and a second output of which gives a bit of the digital signal.

The fact that the comparators are partially controlled can be explained thus: each comparator is formed by a series of elementary current sources, which are parallel mounted and deliver currents in geometrical progression $2^n$: 1, 2, 4, 8 ..., with a transistor as the switch. In a series, such as this, of current sources, some of them may be off, depending on the state of the first output of the logic circuit which controls them, while the others deliver a fixed current.

Furthermore, since each comparator is formed by several sources of elementary currents, the first output of a logic circuit which gives a level n bit controls all the elementary current sources, putting through a current $2^nI_o$, of all the less significant bit levels. There is thus cascading between the conversion levels.

SUMMARY OF THE INVENTION

More precisely, the invention concerns an analog-digital converter converting an input analog signal into an output digital signal formed by several bits, wherein the input signal is addressed in parallel to one and the same set of several bit level circuits connected with one another in cascade, each level being formed by:
  a transducer stage which converts the input voltage into a current which is proportionate to it,
  an analog comparator stage which compares said current with a calibrated current given by several elementary current sources,
  a logic circuit stage, a first output of which gives a control signal applied to the elementary current sources of the less significant bit levels, and a second output which delivers a bit of the digital signal.

BRIEF DESCRIPTION OF THE DRAWINGS

The invention will be better understood from the following detailed description, together with the appended figures, of which.

DESCRIPTION OF PREFERRED EMBODIMENTS

Figure 1:
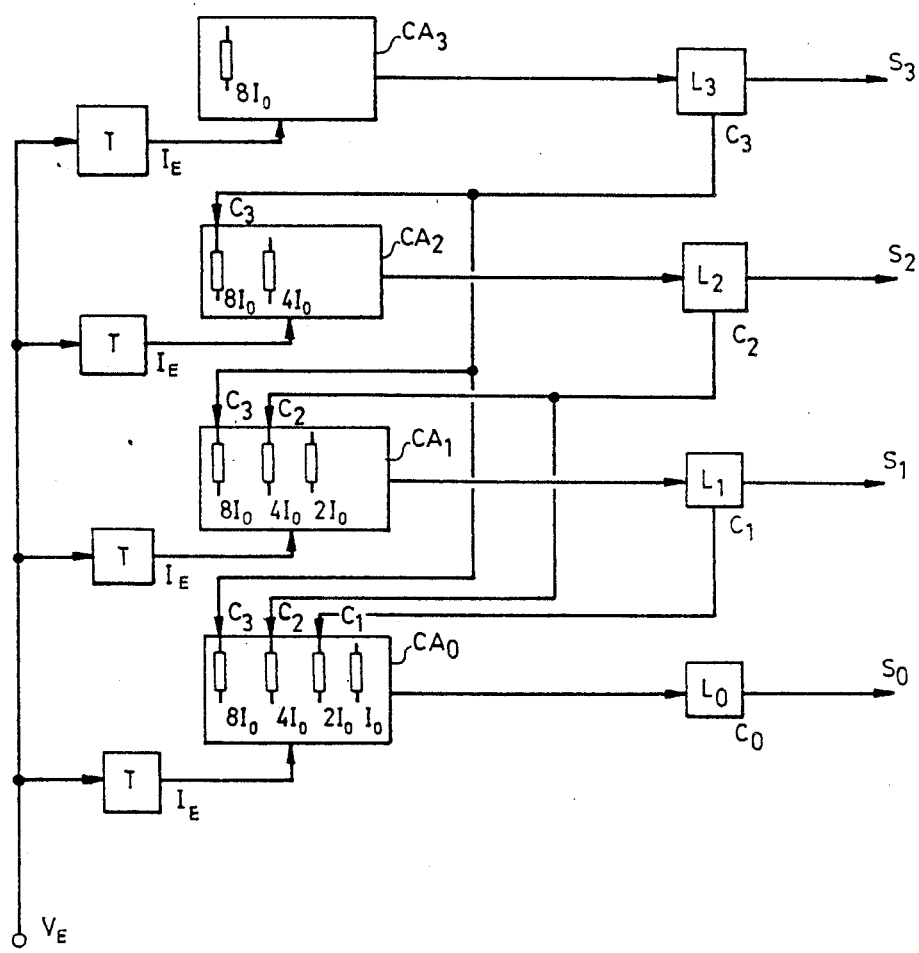
FIG. 1 shows a block diagram of the analog-digital converter according to the invention.

FIG. 1 shows a block diagram of the analog-digital converter (ADC) according to the invention. This diagram is greatly simplified to make the explanation clearer.

An analog signal $V_E$, applied to the input terminal of the ADC, is addressed in parallel to as many transistors T as there are bits in the output digital signal. As a non-restrictive example, the circuit of FIG. 1 converts the analog signal $V_E$ into a digital signal with four bits $S_0, S_1 S_2 S_3$. There are four levels of bits and four input transducers T. Each transducer T, converts the voltage $V_E$ into a current $I_E$ which is proportionate to it. For each bit level, the current $I_E$ is compared with the calibrated current given by an analog comparator CA. An analog comparator has two current sources: the first current source is none other than the transducer T which gives a current $I_E$, and the second comparator is a composite source which gives a current $nI_o$, the value of which is a multiple of an elementary current $I_o$.

A composite source comprises the following, connected in parallel:
  an elementary source, which is not controlled by a transistor and which puts through a constant current $2^nI_o$, n being the order or significance of the bit at the level considered,
  as many elementary sources, each commanded by a transistor, as there are levels of more significant bits above the level considered; furthermore, these elementary sources deliver currents in geometrical progression.

Thus, as an example based on FIG. 1 (i.e. with 4 bits):
  the level 0, the first bit, has a non-controlled source $I_o=2^oI_o$ and three controlled sources $2I_o, 2^2I_o, 2^3I_o$, because there are three levels of bits above the level 0,
  the level 1, the second bit, has a non-controlled source $2^1I_o$ and two controlled sources $2^2I_o, 2^3I_o$.
  the level 2, the third bit, has a non-controlled source $2^2I_o$ and one controlled source $2^3I_o$.
  the level 3, the fourth bit, has only one non-controlled source $2^3I_o$. This is the most significant bit.

The current resulting from the analog comparator is addressed to a logic circuit L provided with two outputs. The first output gives a control signal C which, depending on whether the output of the comparator is in the high state or in the low state, turns on or turns off the control transistors of the corresponding elementary sources of all the comparators of the lower levels. The second output gives a digital signal bit which is the object of the conversion.

Figure 2:
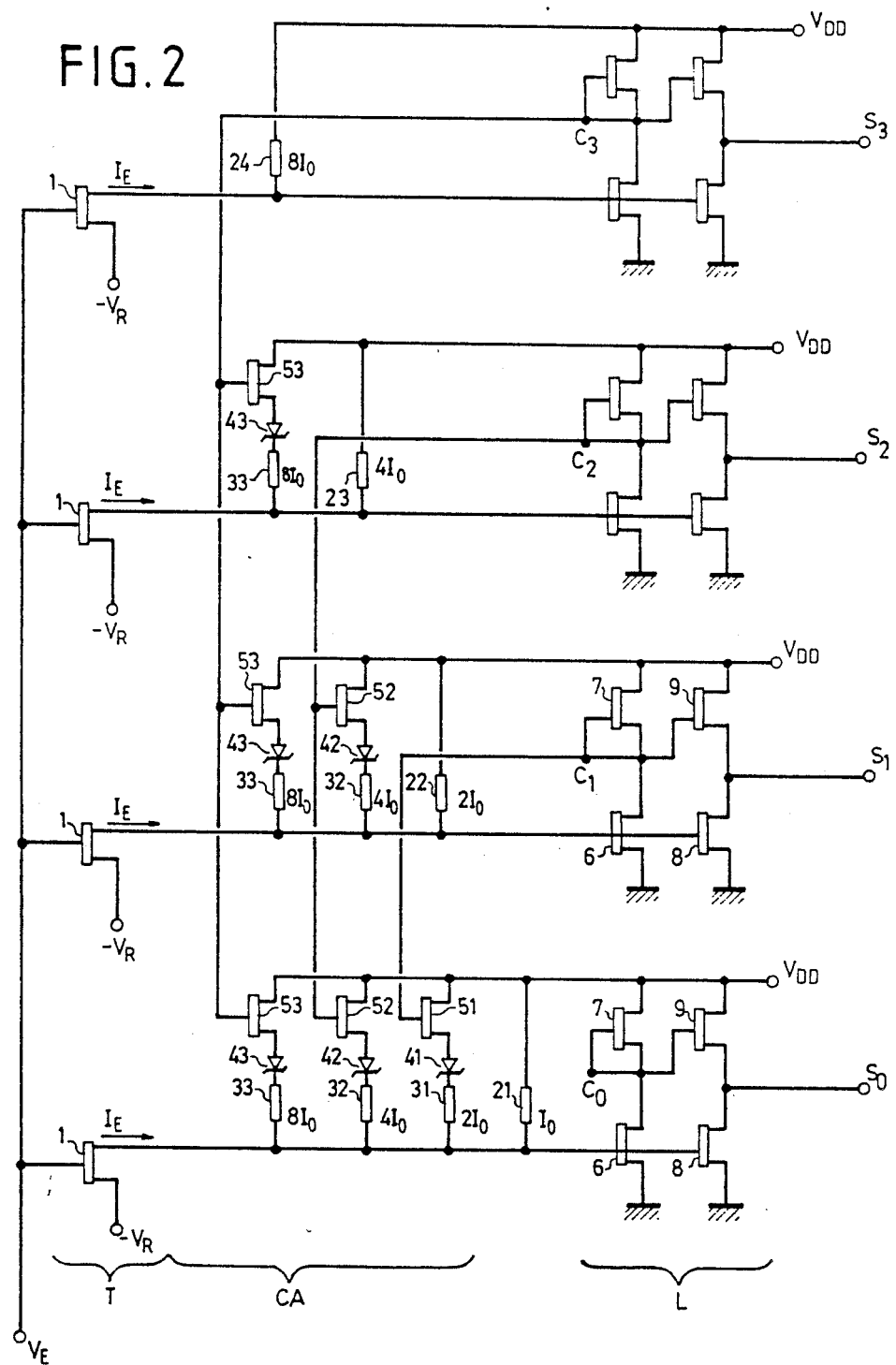
FIG. 2 shows an electrical diagram of the converter of FIG. 1.

This diagram of FIG. 1 shall be shown in detail in FIG. 2 but, before this, a logic model will make the principle of the converter according to the invention more easily understandable.

Let us take a decimal number ranging, for example, between 0 and 63 ($2^6-1$), to be determined by successive approximations in a minimum number of operations. It can be compared with $2^5$ then, depending on the result, it can be compared with $2^5 + 2^4$, then with $2^5 + 2^4 + 2^3$ and so on. Six levels of comparisons are enough to determine a number between 0 ($<2^o$) and 63($2^6-1$).

In the ADC according to the invention, the most significant bit level $2^n$ compares the current $I_E$ with a calibrated current, $2^{n-1}I_o$, then the less significant bit level $2^{n-1}$ compares this same current $I_E$ with a calibrated current $(2^{n-1}+2^{n-2})I_o$ and so on. The least significant bit level $2^0$ compares $I_E$ with a current $$(2^{n-1}+2^{n-2}+\ldots 2^{n-n})I_o.$$

FIG. 2 shows the electrical diagram of the ADC. It repeats the configuration of FIG. 1 and represents only four bits, solely in order to make it clearer, without in any way thereby restricting the scope of the invention.

The analog signal $V_E$ is addressed in parallel to as many transistors 1 as there are bit levels in the output digital signal. Each bit level consists of three stages: the transducer, the comparator and the logic circuits. The first stage converts a voltage $V_E$ into a current $I_E$.

In the second stage, each analog comparator has a composite current source formed by:
- a constant current source, 21 to 24 which is either a resistor or a transistor with its gate connected to a source,
- a series of elementary current sources, each formed by a resistor or a transistor 31 to 33, a series-mounted diode 41 to 43 and a control transistor 51 to 53.

It has already been specified that these elementary current sources deliver currents in geometrical progression $2^nI_o$ and that, furthermore, all the elementary sources putting through a current $2^nI_o$ are controlled by means of their transistors 51 to 53, through the output $C_n$ of the logic circuit of the bit level $S_n$.

At the most significant bit level, the second stage comprises only one non-controlled current source 24.

The total current delivered by a composite current source depends on the control signals C addressed to it by the logic circuits L of the more significant bit levels: this point shall be taken up again further below.

At each bit level, the resultant current of the analog comparator CA is addressed to the logic circuit L of the third stage. This stage is of the DCFL (Direct Coupled FET Logic) type and comprises:
- an inverter, consisting of a normally off transistor 6 and its normally on current source 7.
- a follower consisting of two series-mounted transistors 8 and 9.

The point common to the drain of 6 and to the source of 7 forms a first output, which is addressed to the gate of 9 and gives the control signal C for the lower level comparators CA.

The point common to the drain of 8 and to the source of 9, mounted as a follower source, forms a second output which gives a digital signal bit. This logic circuit is supplied between a voltage $V_{DD}$ and the ground.

The resultant current $I_{CA}-I_E$ of the analog comparator CA is applied in parallel to the two gates of the inverter transistors 6 and 8.

Let it be assumed that this resultant current is at a low level, namely that $I_E>I_{CA}$. The transistor 6 is off because it is of the normally off type. However, the transistor 7, which is of the on type, pulls the voltage of the transistor 6 drain upwards: the control output is at the high state; the signal C is a logic 1 signal. In the same way, the transistor 8 is off but, since the signal applied to the gate of 9 is high, it turns on the transistor 9 and the output S is at the top level: the signal S is a logic 1 signal.

An inverse form of reasoning applies if the resultant current of the analog comparator is in the high state, namely, $I_E<I_{CA}$. In this case, the outputs C and S are in the low state: they are logic 0 signals.

The control signals $C_o$ to $C_3$, coming from the logic circuits of the four levels of bits, each control an elementary current source in all the less significant bit levels. The signal $C_n$, corresponding to an output bit with a significance n, controls all the elementary current sources putting through a current $2^nI_o$.

Thus, the current of each calibrated current source in each level n comparator has the form:

if N is the total number of bit levels.

As an example taken from FIG. 2:

$$I_{CA3} = 2^3I_0 = 8I_0$$

$$I_{CA2} = 2^2I_0 + C_32^3I_0 = 4I_0 + C_38I_0$$

$$I_{CA1} = 2I_0 + C_38I_0 + C_2 \cdot 4I_0$$

$$I_{CA0} = I_0 + C_38I_0 + C_2 \cdot 4I_0 + C_1 \cdot 2I_0$$

The ADC according to the invention thus compares a current $I_E$ with the current $I_{CA}$ given by cascade-mounted comparators, starting with the most significant bit. Whenever there is a drop by one level in the cascade, the comparison interval is shortened by adding, to the current of the upper level, a current smaller than a power of 2 in the geometrical progression.

For a four-bit ADC, as shown in FIG. 2, it is possible to measure sixteen intervals, or sixteen input voltage $V_E$ levels. The following table gives the states of the outputs $S_o$ to $S_3$ as a function of the states of the control signals $C_o$ to $C_3$, and the currents of the comparators $I_{CA0}$ to $I_{CA3}$, for the sixteen levels of $V_E$ or $I_E$.

TABLE 1

| $V_E$ $I_E$ | $I_{CA3}$ $I_0$ | $C_3$ $S_3$ | $I_{CA2}$ $I_0$ | $C_2$ $S_2$ | $I_{CA1}$ $I_0$ | $C_1$ $S_1$ | $I_{CA0}$ $I_0$ | $C_0$ $S_0$ |
|---|---|---|---|---|---|---|---|---|
| 16 | 8 | 1 | 12 | 1 | 14 | 1 | 15 | 1 |
| 15 | 8 | 1 | 12 | 1 | 14 | 1 | 15 | 0 |
| 14 | 8 | 1 | 12 | 1 | 14 | 0 | 13 | 1 |
| 13 | 8 | 1 | 12 | 1 | 14 | 0 | 13 | 0 |
| 12 | 8 | 1 | 12 | 0 | 10 | 1 | 11 | 1 |
| 11 | 8 | 1 | 12 | 0 | 10 | 1 | 11 | 0 |
| 10 | 8 | 1 | 12 | 0 | 10 | 0 | 9 | 1 |
| 9 | 8 | 1 | 12 | 0 | 10 | 0 | 9 | 0 |
| 8 | 8 | 0 | 4 | 1 | 6 | 1 | 7 | 1 |
| 7 | 8 | 0 | 4 | 1 | 6 | 1 | 7 | 0 |
| 6 | 8 | 0 | 4 | 1 | 6 | 0 | 5 | 1 |
| 5 | 8 | 0 | 4 | 1 | 6 | 0 | 5 | 0 |
| 4 | 8 | 0 | 4 | 0 | 2 | 1 | 3 | 1 |
| 3 | 8 | 0 | 4 | 0 | 2 | 1 | 3 | 0 |
| 2 | 8 | 0 | 4 | 0 | 2 | 0 | 1 | 1 |
| 1 | 8 | 0 | 4 | 0 | 2 | 0 | 1 | 0 |

The embodiment of this ADC has only transistors and diodes. The following are of the normally on type:
- the voltage-current transducers 1 (threshold voltage $V_T=-1V$).
- the calibrated current sources 21 to 24 and 31 to 33 ($V_T=-0.5V$).
- the active charges 7 in the inverters ($V_T=-0.5V$).

The other transistors are of the normally off type ($V_T=0.1V$).

The negative pull-back voltage $-V_R$, applied to the sources of the transducers 1, makes it possible to bring the low level of the drain of these transducers to about 0.1 volts, so that it is compatible with the logic circuit L formed by the transistors 6 to 9.

The low level of the control signals C is in the range of +0.2 volts. To completely turn off the control transistors 51 to 53, which have a threshold voltage of =0.1 volts, a diode 41 to 43 is incorporated between the source of the transistors 51 to 53 and the calibrated current sources 31 to 33, thus raising the threshold of the transistors 51 to 53 to about +0.3 volts.

The ADC shown in FIG. 2 can measure voltages between $-1$ volts and $-0.2$ volts in sixteen intervals of 50 mV.

If the input voltage $V_E$ has to be converted with greater precision, for example of eight bits, there have to be 256 intervals and, although the making of transistors with a sensitivity of 10 mV is known, there has to be a threshold voltage of about $-2.5$ volts for the transducer 1.

Figure 3:
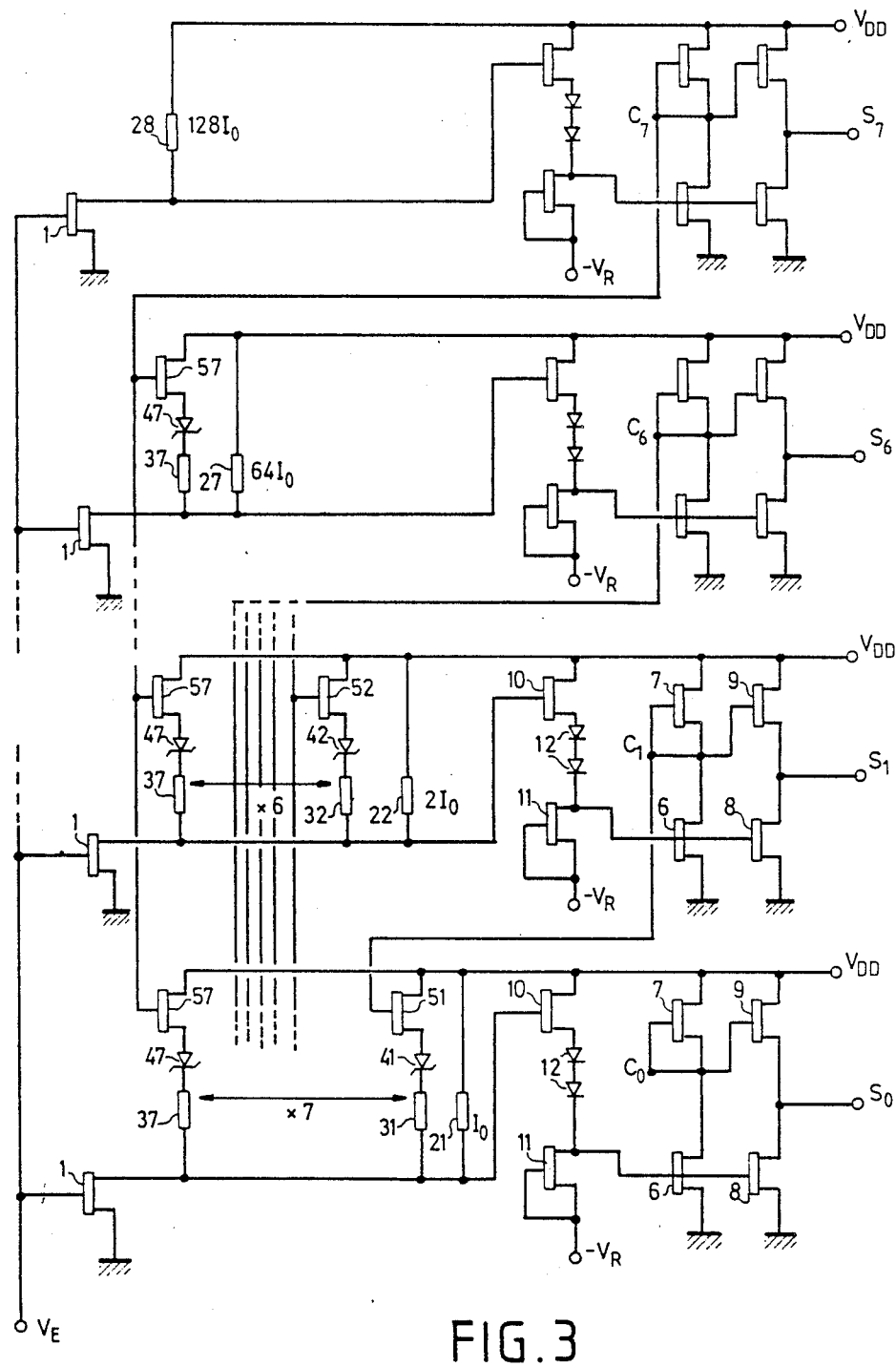
FIG. 3 shows an electrical diagram of an alternative embodiment of the above converter enabling greater precision.

It is then preferable to interpose a shifter/follower stage, such as the one shown in FIG. 3, between the comparator CA and the logic circuit L.

FIG. 3 shows an electric diagram, with eight output bits, of an alternative of the ADC according to the invention. However, to make this figure clearer only the first two and last two bit levels (bits $S_0$ and $S_1$, $S_6$ and $S_7$) have been shown. Furthermore, the comparators of the levels 0 and 1 have been simplified: $CA_0$ has seven elementary current sources 31 to 37 and $CA_1$ has six of them.

The references indices are the same as in FIG. 2.

Apart from the number of bits, FIG. 3 differs from FIG. 2 in two points for each level:
the source of the voltage-current transducers 1 is grounded instead of being connected to $-V_R$.
a shifter/follower stage, supplied between $V_{DD}$ and $-V_R$, is interposed at the output of the comparator CA.

This stage consists of a transistor 10, having a same threshold voltage ($-2.5$ volts) as the transducer, and mounted as a follower source by means of a current source 11, which pulls the voltage towards $-V_R$, and one or more diodes 12 to bring the output voltage to a level compatible with the transistor 6 of the logic circuit. The output signal of the analog comparator is applied to the gate of the transistor 10 and the output signal of the shifter, tapped at the drain of the transistor 11, is applied to the gate of the transistor 6.

The number of components needed to make this 8-bit ADC will give an idea of the value of this structure. For eight bits, the following are required:

transducers 1 = 8 transistors
shifters 10 + 11 = 16 transistors
logic circuits 6 + 7 + 8 + 9 = 32 transistors elementary current sources 21 to 28 and 31 to 37: one transistor for the most significant bit and one additional transistor whenever there is a drop by a bit level, namely 36 transistors, control transistors 51 to 57: 36 transistors giving a total of 128 transistors, to which there must be added 52 diodes, 12 and 41 to 47: the ADC according to the invention has 180 semiconductor components in all.

As a comparison, a standard 8-bit ADC requires 256 linear comparators, for which the sole encoder for converting the analog scale into binary number already requires 1540 transistors.

The only precision elements in the cascade type ADC according to the invention are the 36 elementary current sources 21 to 28 and 31 to 37 (for 8 bits) and the eight transducers 1, the threshold voltage of which has to be controlled to within a few millivolts.

To simplify the figures, the elementary current sources have been represented by the symbol of a resistor. In fact, it is preferable to make them with transistors in which the gate is connected to the source: the channel width controls the intensity delivered, and this has the advantage of creating a unified manufacturing technology based exclusively on semiconductors.

The cascade type ADC according to the invention is used in data processing. It is preferably made in integrated circuit form, on silicon or on III-V materials such as GaAs to work with microwaves. For, between the input signal $V_E$ and the output signal $S_0S_1S_2...$, there are only two gate junctions of the transistors 8, and three junctions if there is a follower 10, thus making it very fast.

What is claimed is:

1. An analog-digital converter converting an input analog signal into an output digital signal formed by several bits, wherein the input signal is addressed in parallel to one and the same set of several bit level circuits connected with one another in cascade, each level being formed by:
   a transducer stage which converts the input voltage into a current which is proportionate to it,
   an analog comparator stage which compares said current with a calibrated current given by several elementary current sources,
   a logic circuit stage, a first output of which gives a control signal applied to the elementary current sources of the less significant bit levels, and a second output which delivers a bit of the digital signal.

2. An analog-digital converter according to claim 1 wherein, at each bit level, the calibrated current of the analog comparator is given by a series of elementary current sources, the delivered currents of which are in geometrical progression $2^nI_o$, the first of the current sources in the series, for each bit level, being not controlled, and the following current sources being each controlled by a transistor which is itself controlled by the signal of the first output of a logic circuit of a more significant bit level.

3. An analog-digital converter according to claim 2, wherein the non-controlled elementary current sources deliver currents in geometrical progression from the least significant bit level up to the most significant bit level, the least significant bit level being assigned the order zero in the geometrical progression $s^nI_o$ ($2^oI_o = I_o$).

4. A converter according to claim 1 wherein:
   the transducer stage has a transistor connected to a transistor of the logic circuit stage such that only two transistor junctions exist between input Ve and output So.

5. An analog-digital converter converting an input analog signal into an output digital signal formed by several bits, wherein the input signal is addressed in parallel to one and the same set of several bit level circuits connected with one another in cascade, each level being formed by:
   a transducer stage which converts the input voltage into a current which is proportionate to it,
   an analog comparator stage which compares said current with a calibrated current given by several elementary current sources, a logic circuit stage, a first output of which gives a control signal applied to the elementary current sources of the less significant bit levels, and a second output which delivers a bit of the digital signal; and wherein, for each bit level, the logic circuit stage comprises:

an inverter formed by a first transistor powered by a current source, the output signal of the analog comparator being applied to the gate of the first transistor;

a follower formed by a second transistor, in parallel with the first transistor and in series with a third transistor mounted as a follower source, the gate of which is controlled by the first output of the inverter, which also gives the control signal to the analog comparators of the less significant bit levels; and the second output of the logic circuit stage is taken from the source of the third transistor and giving a bit of the digital signal.

6. An analog-digital converter according to claim 5, wherein the first, second and third transistors o the logic circuit stage are of the normally off type, with positive threshold voltage.

7. An analog-digital converter converting an input analog signal into an output digital signal formed by several bits, wherein the input signal is addressed in parallel to one and the same set of several bit level circuits connected with one another in cascade, each level being formed by:

a transducer stage which converts the input voltage into a current which is proportionate to it, an analog comparator stage which compares said current with a calibrated current given by several elementary current sources, a logic circuit stage, a first output of which gives a control signal applied to the elementary current sources of the less significant bit levels, and a second output which delivers a bit of the digital signal;

wherein, at each bit level, the calibrated current of the analog comparator stage is given by a series of elementary current sources, the delivered currents of which are in geometrical progression $2^n I_o$, the first of the current sources in the series, for each bit level, being not controlled, and the following current sources being each controlled by a control transistor which is itself controlled by the signal of the first output of a logic circuit of a more significant bit level; and wherein the control transistors of the controlled current sources being of the normally off type, a voltage shifting diode is introduced between each control transistor and the current source which is controlled in order to turn each control transistor off, should the level level of the control signal be slightly positive.

8. An analog-digital converter converting an input analog signal into an output digital signal formed by several bits, wherein the input signal is addressed in parallel to one and the same set of several bit level circuits connected with one another in cascade, each level being formed by:

a transducer stage which converts the input voltage into a current which si proportionate to it, an analog comparator stage which compares said current with a calibrated current given by several elementary current sources, a logic circuit stage, a first output of which gives a control signal applied to the elementary current sources of the less significant bit levels, and a second output which delivers a bit of the digital signal; and wherein, in order to obtain a large number of bits for the output digital signal, and to increase the precision of each bit level, a voltage shifting stage is introduced between the analog comparator stage and the logic circuit stage for each bit level.

9. An analog-digital converter converting an input analog signal into an output digital signal formed by several bits, wherein the input signal is addressed in parallel to one and the same set of several bit level circuits connected with one another in cascade, each level being formed by:

transducer and analog comparator means for converting the input voltage into a proportionate current and for comparing the current with a calibrated current given a plurality of elementary current sources; and logic comparator means connected to said transducer and analog comparator means, said logic comparator means comprising a direct coupled FET logic circuit having two outputs; and wherein a first output of the direct coupled FET logic circuit applies a control signal to the plurality of elementary current sources of the less significant bit levels and a second output delivers a bit of the output digital signal.

* * * * *